(12) United States Patent
Pietambaram et al.

(10) Patent No.: US 11,600,563 B2
(45) Date of Patent: *Mar. 7, 2023

(54) MOLDED EMBEDDED BRIDGE INCLUDING ROUTING LAYERS FOR ENHANCED EMIB APPLICATIONS

(71) Applicant: Intel Corporation, Santa Clara, CA (US)

(72) Inventors: Srinivas Venkata Ramanuja Pietambaram, Chandler, AZ (US); Rahul N. Manepalli, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 113 days.

This patent is subject to a terminal disclaimer.

(21) Appl. No.: 17/096,781

(22) Filed: Nov. 12, 2020

(65) Prior Publication Data

US 2021/0066190 A1    Mar. 4, 2021

Related U.S. Application Data

(63) Continuation of application No. 16/305,733, filed as application No. PCT/US2016/040851 on Jul. 1, 2016, now Pat. No. 10,892,219.

(51) Int. Cl.
*H01L 23/522* (2006.01)
*H01L 23/538* (2006.01)
(Continued)

(52) U.S. Cl.
CPC ........ *H01L 23/5226* (2013.01); *H01L 21/565* (2013.01); *H01L 23/3157* (2013.01);
(Continued)

(58) Field of Classification Search
CPC .......... H01L 24/17; H01L 2224/16227; H01L 2924/15192; H01L 23/481; H01L 23/3157;
(Continued)

(56) References Cited

U.S. PATENT DOCUMENTS

| | | | |
|---|---|---|---|
| 9,704,735 B2 * | 7/2017 | Konchady | H01L 23/5389 |
| 10,892,219 B2 * | 1/2021 | Pietambaram | H01L 21/565 |

(Continued)

FOREIGN PATENT DOCUMENTS

| | | |
|---|---|---|
| EP | 1065717 A2 | 1/2001 |
| JP | 2006270065 A | 10/2006 |

(Continued)

OTHER PUBLICATIONS

U.S. Appl. No. 16/305,733 U.S. Pat. No. 10,892,219, filed Nov. 29, 2018, Molded Embedded Bridge for Enhanced EMIB Applications.

(Continued)

*Primary Examiner* — Khiem D Nguyen
(74) *Attorney, Agent, or Firm* — Schwegman Lundberg & Woessner, P.A.

(57) ABSTRACT

Disclosed is an embedded multi-die interconnect bridge (EMIB) substrate. The EMIB substrate can comprise an organic substrate, a bridge embedded in the organic substrate and a plurality of routing layers. The plurality of routing layers can be embedded within the bridge. Each routing layer can have a plurality of traces. Each of the plurality of routing layers can have a coefficient of thermal expansion (CTE) that varies from an adjacent routing layer.

19 Claims, 6 Drawing Sheets

(51) Int. Cl.
  *H01L 21/56* (2006.01)
  *H01L 23/31* (2006.01)
  *H01L 23/48* (2006.01)
  *H01L 23/00* (2006.01)
  *H01L 25/065* (2023.01)

(52) U.S. Cl.
  CPC ........ *H01L 23/481* (2013.01); *H01L 23/5383* (2013.01); *H01L 23/5386* (2013.01); *H01L 24/17* (2013.01); *H01L 23/3121* (2013.01); *H01L 23/562* (2013.01); *H01L 25/0655* (2013.01); *H01L 2224/16227* (2013.01); *H01L 2924/15192* (2013.01); *H01L 2924/3511* (2013.01); *H01L 2924/35121* (2013.01)

(58) Field of Classification Search
  CPC ............ H01L 23/5383; H01L 23/5226; H01L 23/5386; H01L 23/3121; H01L 23/562
  USPC ....................................................... 257/774
  See application file for complete search history.

(56) References Cited

U.S. PATENT DOCUMENTS

| | | | |
|---|---|---|---|
| 2006/0043567 | A1 | 3/2006 | Palanduz |
| 2007/0080441 | A1 | 4/2007 | Kirkman et al. |
| 2008/0315421 | A1* | 12/2008 | Periaman ............ H01L 25/0657 257/758 |
| 2011/0193203 | A1* | 8/2011 | Goto .................... H01L 23/552 257/737 |
| 2011/0215478 | A1* | 9/2011 | Yamamichi ........... H01L 23/522 257/773 |
| 2012/0261838 | A1* | 10/2012 | Braunisch ........... H01L 25/0652 257/E21.511 |
| 2014/0174807 | A1 | 6/2014 | Roy et al. |
| 2014/0264791 | A1 | 9/2014 | Manusharow et al. |
| 2014/0322864 | A1 | 10/2014 | Haba et al. |
| 2015/0116965 | A1* | 4/2015 | Kim .................... H01L 23/5385 361/767 |
| 2015/0221571 | A1 | 8/2015 | Chaparala et al. |
| 2015/0340353 | A1 | 11/2015 | Starkston et al. |
| 2016/0105960 | A1 | 4/2016 | Sakamoto et al. |
| 2016/0329284 | A1 | 11/2016 | We et al. |
| 2017/0207155 | A1 | 7/2017 | Kim et al. |
| 2017/0287838 | A1 | 10/2017 | Pietambaram et al. |
| 2019/0206791 | A1 | 7/2019 | Pietambaram et al. |

FOREIGN PATENT DOCUMENTS

| | | |
|---|---|---|
| TW | 201813039 A | 4/2018 |
| WO | WO-2018004692 A1 | 1/2018 |

OTHER PUBLICATIONS

"European Application Serial No. 16907642.9, Response filed Aug. 2, 2021 to Communication Pursuant to Article 94(3) EPC dated Apr. 9, 2021", 43 pgs.

"European Application Serial No. 16907642.9, Communication Pursuant to Article 94(3) EPC dated Apr. 9, 2021", 4 pgs.

"U.S. Appl. No. 16/305,733, Corrected Notice of Allowability dated Dec. 9, 2020", 2 pgs.

"Taiwanese Application Serial No. 106117132, Response filed Nov. 27, 2020 to Office Action dated Aug. 27, 2020", w English claims, 56 pgs.

"U.S. Appl. No. 16/305,733, Non Final Office Action dated Feb. 26, 2020", 14 pgs.

"U.S. Appl. No. 16/305,733, Non Final Office Action dated Oct. 24, 2019", 14 pgs.

"U.S. Appl. No. 16/305,733, Notice of Allowance dated Aug. 11, 2020", 5 pgs.

"U.S. Appl. No. 16/305,733, Response filed May 26, 2020 to Non Final Office Action dated Feb. 26, 2020", 8 pgs.

"U.S. Appl. No. 16/305,733, Response Filed Dec. 5, 2019 to Non Final Office Action dated Oct. 24, 2019", 9 pgs.

"European Application Serial No. 16907642.9, Extended European Search Report dated Jan. 15, 2020", 9 pgs.

"European Application Serial No. 16907642.9, Response filed Jul. 16, 2020 to Extended European Search Report dated Jan. 15, 2020", 15 pgs.

"International Application Serial No. PCT/US2016/040851, International Search Report dated Mar. 31, 2017", 3 pgs.

"International Application Serial No. PCT/US2016/040851, Written Opinion dated Mar. 31, 2017", 6 pgs.

\* cited by examiner

MOLDED EMBEDDED BRIDGE INCLUDING ROUTING LAYERS FOR ENHANCED EMIB APPLICATIONS

CROSS-REFERENCE TO RELATED APPLICATION

This application is a continuation of U.S. patent application Ser. No. 16/305,733, filed on Nov. 29, 2018, issued as U.S. Pat. No. 10,892,219, which is a U.S. National Stage Filing under 35 U.S.C. 371 from International Application No. PCT/US2016/040851, filed on Jul. 1, 2016, each of which application is incorporated herein by reference in its entirety.

TECHNICAL FIELD

Embodiments described herein relate generally to electronic device packages, and more particularly to interconnect bridges in package substrates.

BACKGROUND

Microelectronics generally include a central processing unit (CPU). In order to enhance performance, CPU products are increasingly integrating multiple dies within the CPU package in a side-by-side or other multi-chip module (MCM) format. An embedded multi-die interconnect bridge (EMIB) is a way to electrically connecting multiple dies within a microelectronic package.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

An embedded multi-die interconnect bridge (EMIB) enables low cost and 2.5D packaging for high density interconnects between heterogeneous die on a single package. Instead of an expensive silicon (Si) interposer with through silicon vias (TSV), a small silicon bridge chip, termed as EMIB, can be embedded in an organic package substrate, and can enable high-density die-to-die connections only where needed. Standard flip-chip assembly can be used for robust power delivery and to connect high-speed signals directly from a chip to the package substrate using this bridge. EMIBs eliminate the need for TSVs and specialized interposer silicon that add complexity and cost.

While an EMIB offers significant advantages and cost benefits over silicon interposer or high-density substrate surface layers, it does have some issues. The bridge that is Si-based is still manufactured using costly wafer fab processes. In addition, a low coefficient of thermal expansion (CTE) of the Si bridge compared to the buildup dielectric that it is embedded in, EMIB substrates suffer from thermomechanical issues such as heat induced stresses, warpage, delamination, etc both within the substrate as well as post flip chip attachment. The thermomechanical issues can therefore limit the Si bridge size that can be embedded. Furthermore, use of silicon design rules, can restrict creation of metal reference planes that are crucial for high speed input/output (I/O) signaling in the embedded silicon bridge.

As disclosed herein, to overcome the thermomechanical issues, a molded fine line and spaced (FLS) interconnect bridge with graded CTEs can be employed to balance/minimize the CTE mismatch that can occur in EMIB substrates and can be manufactured using low cost substrate, molded embedded pane-level ball (EPLB) grid array packaging processes. A further benefit of this architecture is the ability to use substrate design rule like reference planes in the design in that can truly offer wider flexibility for design in enabling a high-speed embedded bridge.

Figure 1:
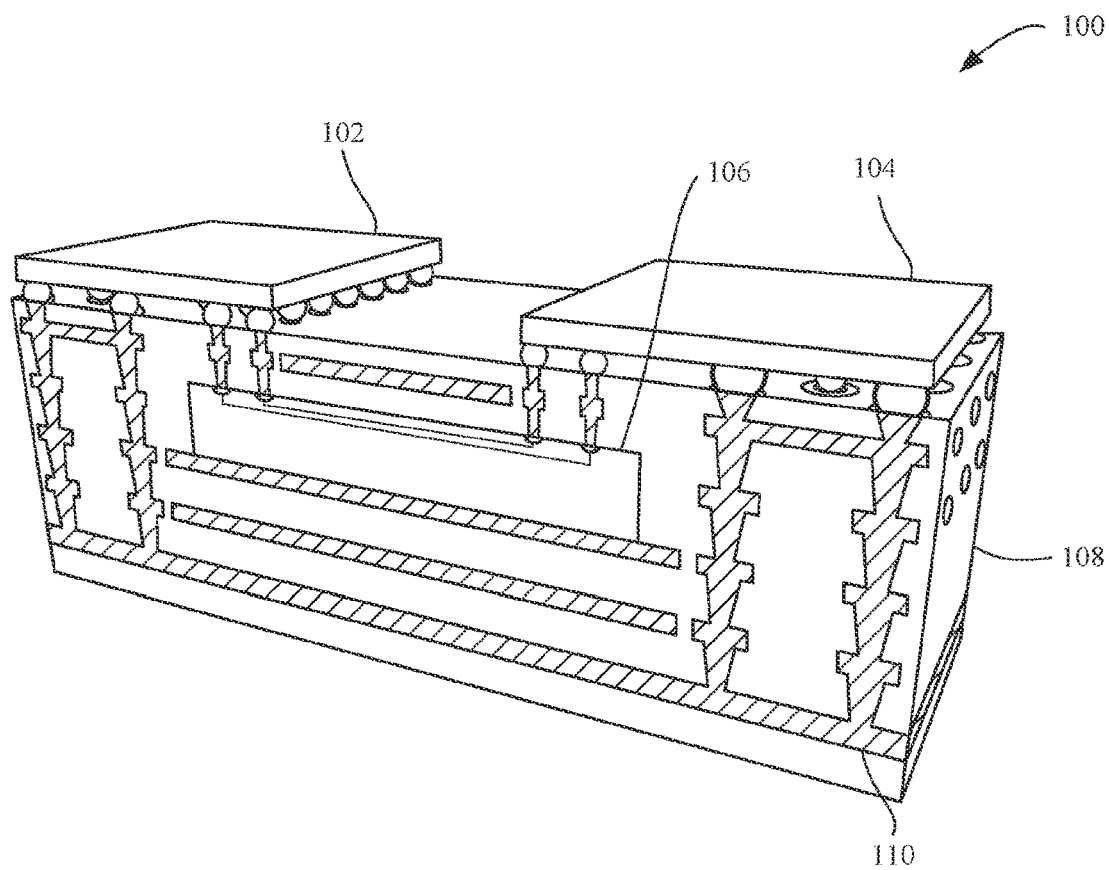
FIG. 1 illustrates a microelectronic package in accordance with some embodiments disclosed herein.
Figure 2:
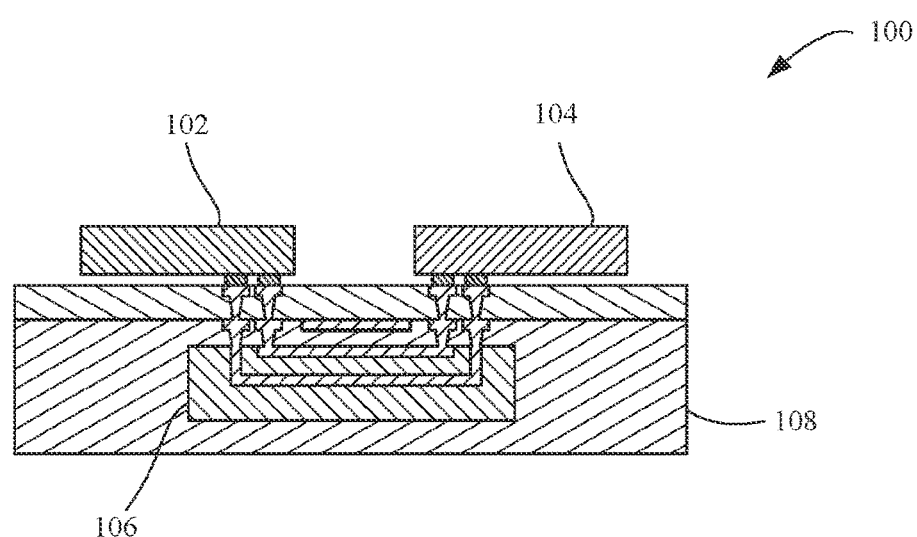
FIG. 2 illustrates a cross-section of a microelectronic package in accordance with some embodiments disclosed herein.

Turning now to the figures, FIG. 1 illustrates a microelectronic package 100. FIG. 2 illustrates a cross-section of the microelectronic package 100. The microelectronic package 100 can include a first die 102, a second die 104, an EMIB 106, and substrate 108. As shown in FIG. 1, the microelectronic package 100 can also include electrical connections 110 that can be used to power the first die 102 and the second die 104 and allow signals to pass between the first die 102 and the second die 104. The electrical connections 110 can also be used to provide ground references.

As shown in FIG. 1, the EMIB 106 can be surrounded, or embedded, in the substrate 108. The substrate 108 may have a high CTE. For example, the substrate 108 may be made of a dielectric with a CTE of approximately 30/° C. or higher. The EMIB 10 may have a low CTE compared to the substrate 108. For example, the EMIB 106 may be made of a silicon (Si) alloy or epoxy/Si material that has a CTE of approximately 3/° C.

Figure 3:
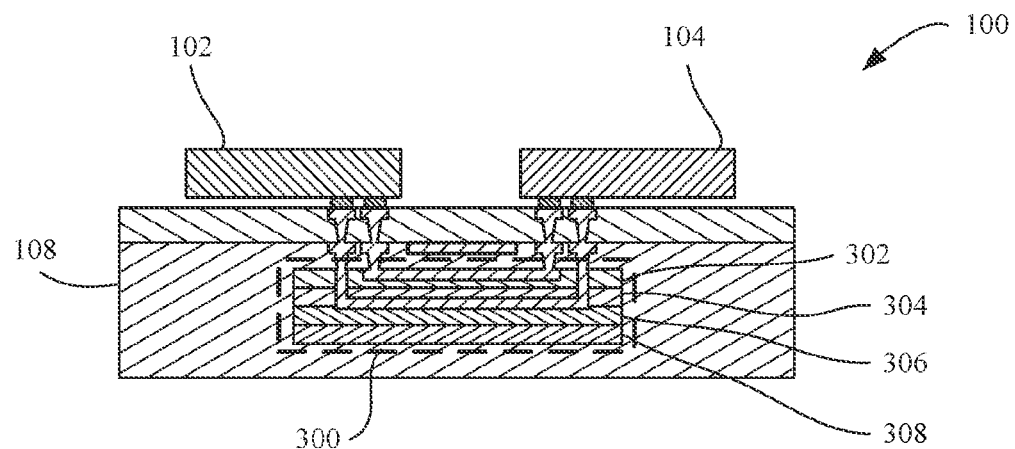
FIG. 3 illustrates a layered EMIB in accordance with some embodiments disclosed herein.

The mismatch in CTE between the buildup dielectric and EMIB can cause thermal stresses and warpage within the substrate 108. The thermal stresses and warpage can lead to delamination and fracturing of the various layers that make up the EMIB substrate 108. FIGS. 3-5 show various solutions to combat the mismatch in CTE in accordance with embodiments disclosed herein.

FIG. 3 illustrates a layered EMIB 300 in accordance with embodiments disclosed herein. As shown in FIG. 3, the EMIB 300 can include a first layer 302, a second layer 304, a third layer 30, and a fourth layer 308 (collectively referred to as layers). During operation, heat generated with the EMIB 300 can be dissipated into the substrate 108 and other components, such as heat sinks attached to the first die 102 and the second die 104. As the heat is both generated and dissipated, the layers within the EMIB 300 can heat at different rates due to the amount of electric current flowing through the layers, their proximity to other heat sources and sinks and layer material properties. The layers can be molded layers. As such, each of the layers can include a molded material.

To combat the uneven heating, and hence warpage, delamination, etc., each of the layers can be created to have a different CTE. For example, the CTE of the first layer 302 may be 25/° C., the CTE of the second layer 304 may be 18/° C., the CTE of the third layer 306 may be 12/° C., and the CTE of the fourth layer 308 may be 7/° C. The CTE of the layers need not decrease in a direction away from the first die 102 and the second die 104 and instead may increase. For example, the CTE of the first layer 302 may be 7/° C., the CTE of the second layer 304 may be 12/° C., the CTE of the third layer 306 may be 18/° C., and the CTE of the fourth layer 308 may be 25/° C.

The variation in CTE from one layer to another can be adjusted depending on the application and materials used to build the layers. For example, the CTE can vary linearly or non-linearly. The CTE range can also differ from application to application. For example, an EMIB substrate in a liquid cooled computer may able to dissipate heat faster and therefore the CTE range of the EMIB 300 may not to be as large as an EMIB substrate in a computer that used a gas (e.g., air) as a cooling fluid.

The variation in CTE can be achieved using differing levels of a dopant used to manufacture the layers. For example, the layers can be manufactured from materials such as, but not limited to, Epoxy Phenol, Epoxy Anhydride, or Epoxy Amine and a filler material such as, but not limited to, silica. By varying the ration of silica to epoxy, the CTE of the layers can be varied. For instance, a layer with an approximately 9:1 ratio of epoxy to filler may have a CTE of 7/° C. and a layer with an approximately 7:3 ratio of epoxy to filler may have a CTE of 30/° C.

In addition, the variation in CTE can be achieved by using different filler materials. For example, the layers can be manufactured from Epoxy Phenol and materials such as, but not limited to, silica, alumina, or an organic compound can be used as fillers for different layers. Using the various filler materials, the CTE of the layers can be varied from between approximately 7/° C. to approximately 50/° C.

As disclosed herein, each of the layers can be routing layers or ground layers embedded within the substrate 108. Each of the layers can include various traces or other electrically conductive pathways. Each of the layers can be positioned such that adjacent layers have CTEs that vary from one another as described herein.

Figure 4A:
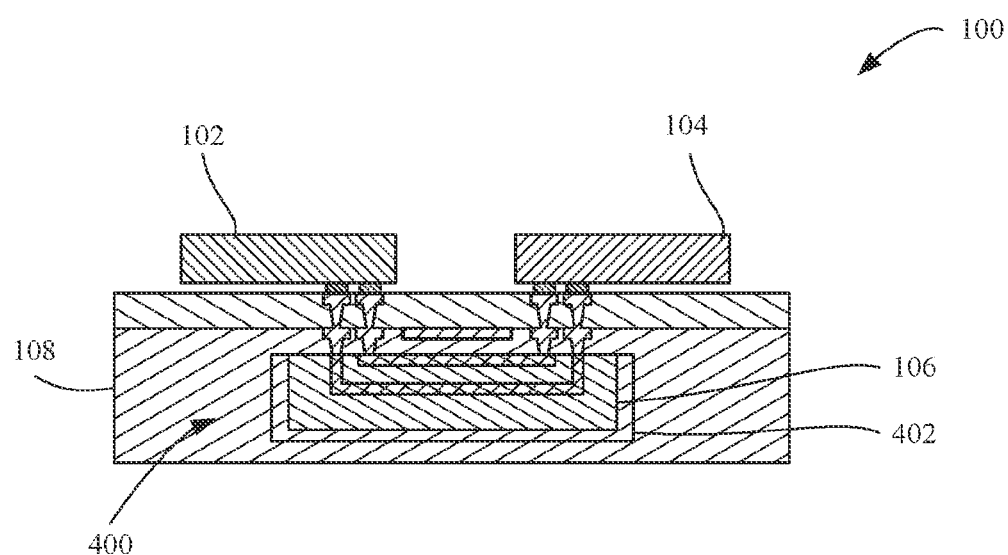
FIGS. 4A and 4B illustrate an encapsulated EMIB in accordance with some embodiments disclosed herein.
Figure 5:
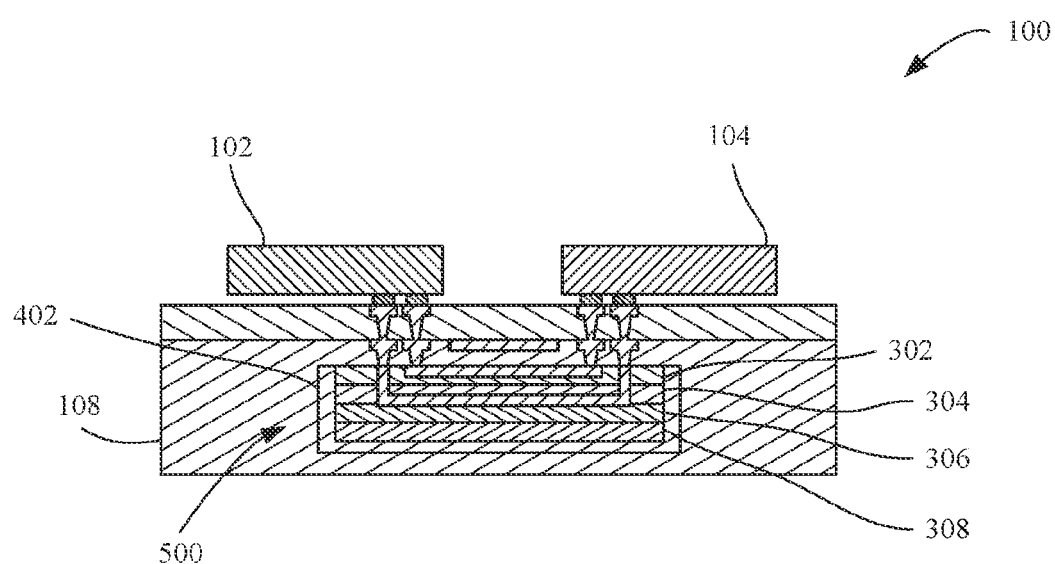
FIG. 5 illustrates an encapsulated layered EMIB in accordance with some embodiments disclosed herein.

FIG. 4A illustrates an encapsulated EMIB 400 in accordance with some embodiment disclosed herein. As shown in FIG. 4A, the EMIB 106 can be encapsulated by a mold 402. The mold 402 can have a CTE that is close to the CTE of the substrate 108 in which the EMIB 106 is embedded in. For example, the CTE of the substrate 108 may be 25/° C. and the CTE of the mold 402 may be 20/° C. In addition, the CTE of the mold 402 can be close to the CTE of the EMIB 106. For example, the CTE of the EMIB 106 may be 7/° C. and the CTE of the mold 402 may be 11/° C. Furthermore, the CTE of the mold 402 can be in between the CTEs of the EMIB 106 and the substrate 108. For example, the CTE of the EMIB 106 may be 7/° C., the CTE of the substrate 108 may be 25/° C., and the CTE of the mold 402 may be 11/° C.

Having the CTE of the mold 402 be somewhere in between the CTE of the EMIB 106 and the substrate 108 can allow the mold 402 to absorb some of the thermal stresses that can be induced by the heating and CTE differences between the EMIB 106 and the substrate 108. In addition, the mold 402 can be manufactured of a material that can facilitate heat transfer in a desired direction. For example, to help dissipate heat from the EMIB 106 to the substrate 108, the mold 402 can be manufactured of a material with a high thermal conductivity. To help insulate the EMIB 106 from heat that may be generated within the substrate 108, the mold 402 may be manufactured with a material that has a low thermal conductivity. As such, heat generated within the EMIB 106 can be directed in a direction towards the first die 102 and the second die 104, to be removed from heat sinks attached to the first die 102 and the second die 104.

The mold 402 can encapsulate all or a portion of the EMIB 106. For example, as shown in FIG. 4A, the mold 402 can surround the EMIB 106 on all sides except a side proximate the first die 102 and the second die 104. Other sides of the EMIB 106 can be exposed.

Figure 4B:
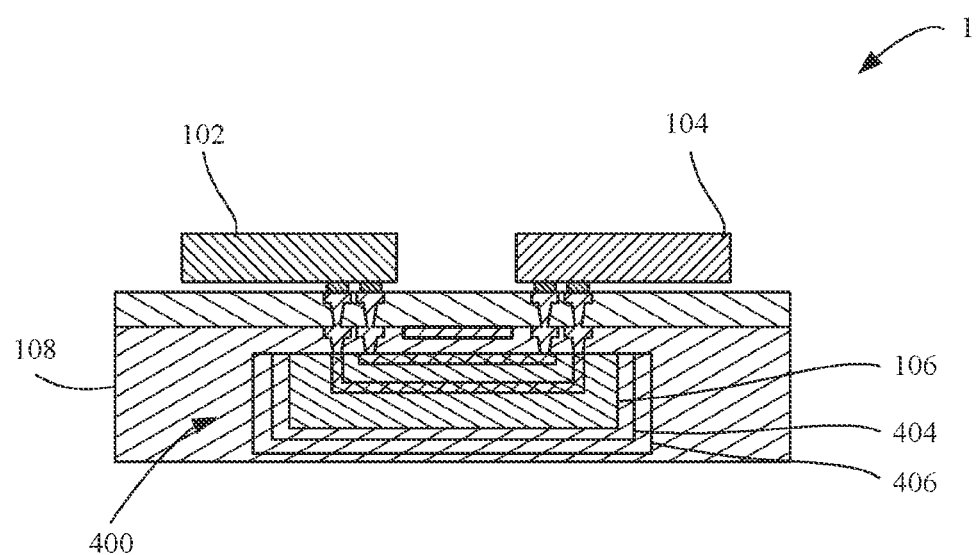

The mold 402 can be manufactured from materials and fillers as described above with respect to the layers. In addition, the mold 402 can be manufactured from multiple layers as well. For example, as shown in FIG. 4B, the mold 402 can be manufactured from a first layer 404 and a second layer 406. While FIG. 4B shows only two layers, any number of layers can be used to manufacture the mold 402. Furthermore, the CTE for the layers of the mold 402 can be varied as described above.

FIG. 5 illustrates an encapsulated layered EMIB 500 in accordance with some embodiment disclosed herein. As shown in FIG. 5, the EMIB 500 can include the mold 402 and the EMIB 106. The EMIB 106 can include the first layer 302, the second layer 304, the third layer 306, and the fourth layer 308. In addition, the mold 402 can be layered as described above.

The combination of the mold 402 and the layers can allow for the CTE of the EMIB 500 to be further customized. For example, the layers can each have different CTEs for thermal management. The mold 402 can have a CTE that further reduces the mismatch in CTE between the layers and the substrate 108. For example, the CTEs of the layers can van from, for example, 7/° C. to 25/° C. and the CTE of the mold 402 can be 30?C. For a layered mold 402, the CTEs of the layers can range from 7/° C. to 15/° C. and the layers of the mold 402 can vary from 20/° C. to 30/° C.

Figure 6:
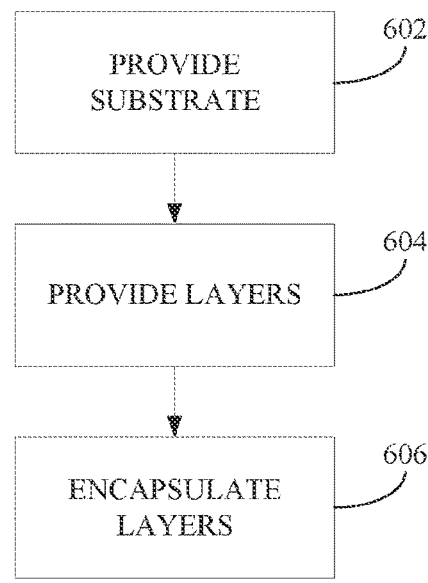
FIG. 6 illustrates a method in accordance with some embodiments disclosed herein.
Figure 7B:
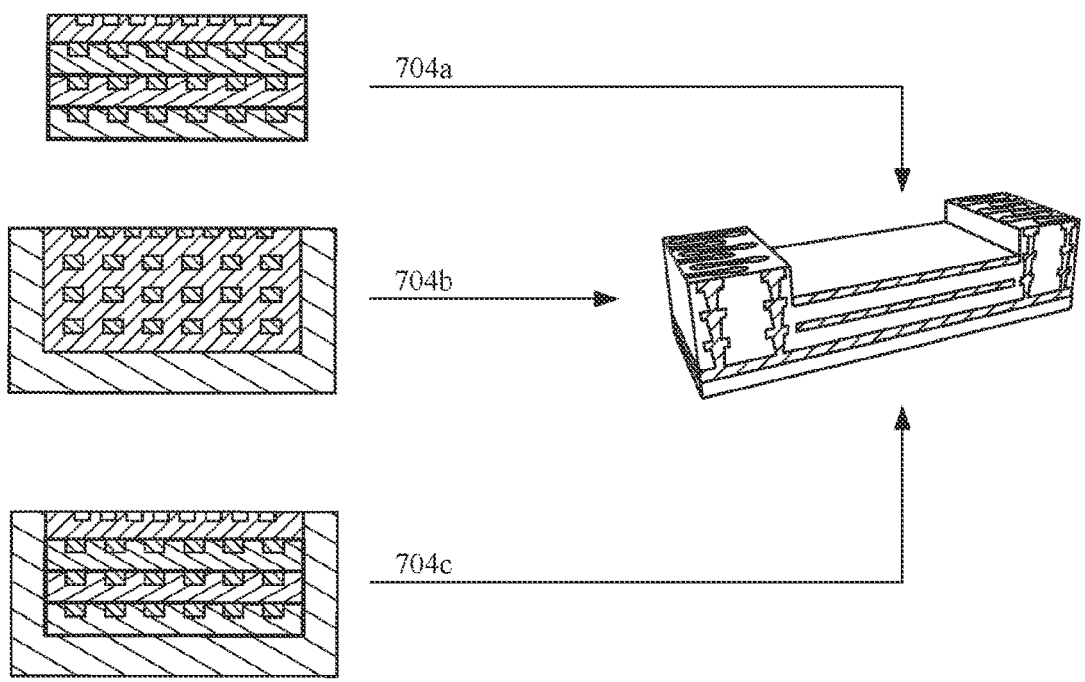
FIGS. 7A and 7B illustrated process steps in accordance with some embodiments disclosed herein.
Figure 7A:
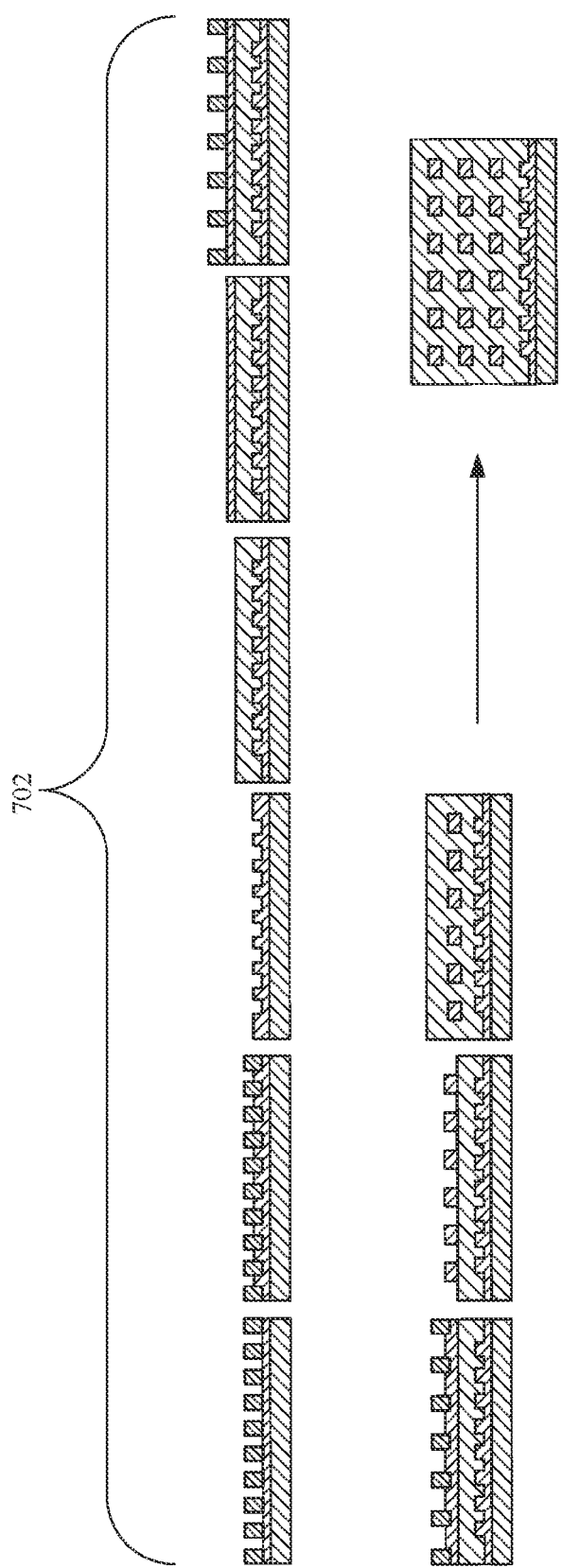

FIG. 6 illustrates a method 600 for manufacturing an EMIB embedded substrate in accordance with some embodiments disclosed herein. FIG. 6 will be discussed with reference to FIGS. 7A and 7B showing the process steps for the method 600 in accordance with some embodiments disclosed herein. The method 600 can be implemented in a high volume manufacturing (HVM) processing line.

The method 600 can begin at stage 602 where a substrate can be provided. From stage 602, the method 600 can proceed to stage 604 where layers can be created (process stage 702). For example, the very dense and fine line spaced layers can be created using high-resolution lithography. During the creation of the layers, very dense and fine line spaced layers can be created on a first layer using high-resolution lithography. The traces in the subsequent layers may not be as fine as in the first layer. However, the subsequent layers can be handled through fan out routing. In addition, subsequent layers can utilize small filler sizes coupled with less filling to result in CTE variations. For instance, using less filling material can result in progressively higher CTE as subsequent layers are produced. The result can be reasonably fine tracing that can reduce the amount of fan out needed.

As discussed herein, during the creations of the layers, the amount of filler can be varied to alter the CTE of each layer.

In addition, the filler can be different for different layers to result in alteration of the CTE from layer to layer. Furthermore, as discussed above, the layers do not have to have a CTE that varies. For instance, the bridge formed by the layers can have a uniform CTE.

From stage 604, the method 600 can proceed to stage 606 where the layers can be encapsulated by a mold. As discussed above, the mold can have a CTE that is higher than the CTE of the layers forming the bridge. In addition, the mold can be formed of layers that have CTEs that vary from one another.

Encapsulating the layers can include utilizing an EPLB type process flow used to over-mold a high CTE material to encapsulate the layers. The material proximate the substrate can have a CTE that is as close as possible to that of the buildup dielectric.

Note that not all the stages in the method 600 have to be performed. For example, the layers can be created with CTEs that vary (stage 604) as described herein and the resulting bridge can be embedded to form the microelectronic package (process stage 704a). Stated another way, stage 606 can be omitted from the method 600. In addition, the bridge can be formed with layers that have a uniform CTE and the bridge can then be encapsulated (stage 606) and installed to form the microelectronic package (process stage 704b). Finally, the bridge can be formed with layers having CTEs that vary (stage 604) and the bridge encapsulated (stage 606). The encapsulated bridge can then be embedded to form the microelectronic package (process stage 704c).

Figure 8:
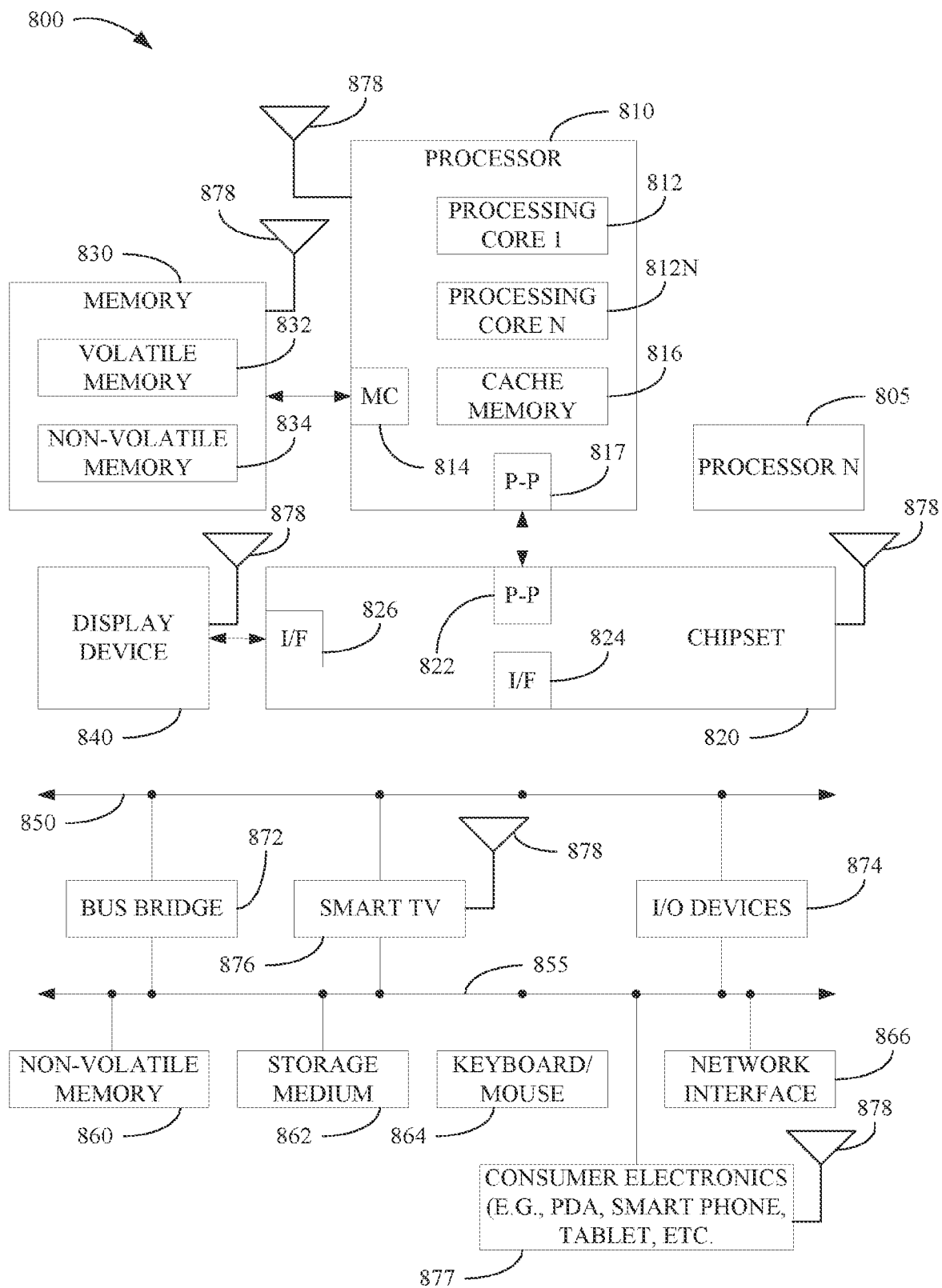
FIG. 8 illustrates a system level diagram in accordance with some embodiments disclosed herein.

FIG. 8 illustrates a system level diagram, according to one embodiment of the invention. For instance, FIG. 8 depicts an example of an electronic device (e.g., system) including the microelectronics package 100 as described herein. FIG. 8 is included to show an example of a higher level device application for the present invention. In one embodiment, system 800 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 800 is a system on a chip (SOC) system.

In one embodiment, processor 810 has one or more processing cores 812 and 812N, where 812N represents the Nth processor core inside processor 810 where N is a positive integer. In one embodiment, system 800 includes multiple processors including 810 and 805, where processor 805 has logic similar or identical to the logic of processor 810. In some embodiments, processing core 812 includes, but is not limited to, pre-fetch logic to fetch instructions, decode logic to decode the instructions, execution logic to execute instructions and the like. In some embodiments, processor 810 has a cache memory 816 to cache instructions and/or data for system 800. Cache memory 816 may be organized into a hierarchal structure including one or more levels of cache memory.

In some embodiments, processor 810 includes a memory controller 814, which is operable to perform functions that enable the processor 810 to access and communicate with memory 830 that includes a volatile memory 832 and/or a non-volatile memory 834. In some embodiments, processor 810 is coupled with memory 830 and chipset 820. Processor 810 may also be coupled to a wireless antenna 878 to communicate with any device configured to transmit and/or receive wireless signals. In one embodiment, the wireless antenna interface 878 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 832 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 834 includes, but is not limited to, flash memory, phase change memory (PCM), read-only memory (ROM), electrically erasable programmable read-only memory (EEPROM), or any other type of non-volatile memory device.

Memory 830 stores information and instructions to be executed by processor 810. In one embodiment, memory 830 may also store temporary variables or other intermediate information while processor 810 is executing instructions. In the illustrated embodiment, chipset 820 connects with processor 810 via Point-to-Point (PtP or P-P) interfaces 817 and 822. Chipset 820 enables processor 810 to connect to other elements in system 800. In some embodiments of the invention, interfaces 817 and 822 operate in accordance with a PtP communication protocol such as the Intel® QuickPath Interconnect (QPI) or the like. In other embodiments, a different interconnect may be used.

In some embodiments, chipset 820 is operable to communicate with processor 810, 805N, display device 840, and other devices 872, 876, 874, 860, 862, 864, 866, 877, etc. Chipset 820 may also be coupled to a wireless antenna 878 to communicate with any device configured to transmit and/or receive wireless signals.

Chipset 820 connects to display device 840 via interface 826. Display 840 may be, for example, a liquid crystal display (LCD), a plasma display, cathode ray tube (CRT) display, or any other form of visual display device. In some embodiments of the invention, processor 810 and chipset 820 are merged into a single SOC. In addition, chipset 820 connects to one or more buses 850 and 855 that interconnect various elements 874, 860, 862, 864, and 866. Buses 850 and 855 may be interconnected together via a bus bridge 872. In one embodiment, chipset 820 couples with a non-volatile memory 860, a mass storage device(s) 862, a keyboard/mouse 864, and a network interface 866 via interface 824 and/or 804, smart TV 876, consumer electronics 877, etc.

In one embodiment, mass storage device 862 includes, but is not limited to, a solid state drive, a hard disk drive, a universal serial bus flash memory drive, or any other form of computer data storage medium. In one embodiment, network interface 866 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 8 are depicted as separate blocks within the system 800, the functions performed by some of these blocks may be integrated within a single semiconductor circuit or may be implemented using two or more separate integrated circuits. For example, although cache memory 816 is depicted as a separate block within processor 810, cache memory 816 (or selected aspects of 816) can be incorporated into processor core 812.

ADDITIONAL NOTES & EXAMPLES

Example 1 includes an embedded multi-die interconnect bridge (EMIB) substrate. The EMIB substrate can comprise an organic substrate and a bridge. The bridge can include a plurality of routing layers. The bridge can be embedded in the organic substrate. The plurality of routing layers can be embedded within the bridge. Each routing layer can have a plurality of traces. Each of the plurality of routing layers can have a coefficient of thermal expansion (CTE) that varies from an adjacent routing layer.

In Example 2, the EMIB substrate of Example 1 can optionally include the CTE of each of the plurality of routing layers varying linearly from one routing layer to another.

In Example 3, the EMIB substrate of Example 1 can optionally include the CTE of each of the plurality of routing layers varying non-linearly from one routing layer to another.

In Example 4, the EMIB substrate of any one of or any combination of Examples 1-3 can optionally include a routing layer of the plurality of routing layers with the lowest CTE being adjacent a die interconnect region of the EMIB substrate.

In Example 5, the EMIB substrate of any one of or any combination of Examples 1-4 can optionally include a mold having a CTE higher than a highest CTE of one of the plurality of routing layers. The mold can encapsulate a portion of the plurality of routing layers.

In Example 6, the EMIB substrate of any one of or any combination of Examples 1-5 can optionally include the variation in CTE for each of the plurality of routing layers resulting from each of the plurality of routing layers having a different silica filler content.

In Example 7, the EMIB substrate of any one of or any combination of Examples 1-5 can optionally include the CTE of the plurality of routing layers varying from about 7/° C. to about 25/° C.

Example 8 can include an embedded multi-die interconnect bridge (EMIB) substrate. The EMIB substrate can comprise an organic substrate, a bridge, and a mold. The bridge can include a plurality of routing layers. The plurality of routing layers can be embedded within the bridge. Each routing layer can have a plurality of traces. The mold can encapsulate a majority of the plurality of routing layers. The mold can have a coefficient of thermal expansion (CTE) that is greater than a CTE of the plurality of routing layers.

In Example 9, the EMIB substrate of Example 8 can optionally include the CTE of each of the plurality of routing layers varying linearly from one routing layer to another.

In Example 10, the EMIB substrate of Example 8 can optionally include the CTE of each of the plurality of routing layers varying non-linearly from one routing layer to another.

In Example 11, the EMIB substrate of any one of or any combination of Examples 8-10 can optionally include a routing layer of the plurality of routing layers is adjacent a die interconnect region of the EMIB substrate.

In Example 12, the EMIB substrate of any one of or any combination of Examples 8-11 can optionally include a variation in CTE for each of the plurality of routing layers resulting from each of the plurality of routing layers having a different silica filler content.

In Example 13, the EMIB substrate of any one of or any combination of Examples 8-11 can optionally include the CTE of the plurality of routing layers being about 7/° C. and the CTE of the mold is about 30/° C.

Example 14 can include an embedded multi-die interconnect bridge (EMIB) substrate. The EMIB substrate can comprise an organic substrate, a bridge, and a mold. The bridge can include a plurality of routing layers. The bridge cam be embedded in the organic substrate. The plurality of routing layers can be embedded within the bridge. Each routing layer can have a plurality of traces. Each of the plurality of routing layers can have a coefficient of thermal expansion (CTE) that varies from about 7/° C. to about 25/° C. The mold can have a CTE higher than a highest CTE of one of the plurality of routing layers. The mold can encapsulate a portion of the plurality of routing layers.

In Example 15, the EMIB substrate of Example 14 can optionally include the CTE of each of the plurality of routing layers varying linearly from one routing layer to another.

In Example 16, the EMIB substrate of Example 14 can optionally include the CTE of each of the plurality of routing layers varying non-linearly from one routing layer to another.

In Example 17, the EMIB substrate of any one of or any combination of Examples 14-16 can optionally include a routing layer of the plurality of routing layers with the lowest CTE being adjacent a die interconnect region of the EMIB substrate.

In Example 18, the EMIB substrate of any one of or any combination of Examples 14-17 can optionally include the variation in CTE for each of the plurality of routing layers resulting from each of the plurality of routing layers having a different silica filler content.

In Example 19, the EMIB substrate of any one of or any combination of Examples 14-18 can optionally include the CTE of the mold being about 30/° C.

Example 20 can include a method of manufacturing an embedded multi-die interconnect bridge (EMIB) substrate. The method can comprise forming a bridge including a plurality of routing layers, each of the plurality of routing layers having a coefficient of thermal expansion (CTE) that varies from an adjacent routing layer; and embedding the bridge in an organic substrate.

In Example 21, the method of Example 20 can optionally include forming the plurality of routing layers including forming each of the plurality of routing layers such that the CTE of each of the plurality of routing layers varies linearly from one routing layer to another.

In Example 22, the method of Example 20 can optionally include forming the plurality of routing layers including forming each of the plurality of routing layers such that the CTE of each of the plurality of routing layers varies non-linearly from one routing layer to another.

In Example 23, the method of any one of or any combination of Examples 20-22 can optionally include forming the plurality of routing layers including forming a routing layer of the plurality of routing layers with the lowest CTE adjacent a die interconnect region of the EMIB substrate.

In Example 24, the method of any one of or any combination of Examples 20-23 can optionally include encapsulating a portion of the plurality of routing layers with a mold. The mold can have a CTE higher than a highest CTE of one of the plurality of routing layers.

In Example 25, the method of any one of or any combination of Examples 20-24 can optionally include forming the plurality of routing layers including forming each of the plurality of routing layers with a different silica filler content.

In Example 26, the method of any one of or any combination of Examples 20-25 can optionally include the CTE of the plurality of routing layers varying from about 7/° C. to about 25/° C.

Example 27 can include a method of manufacturing an embedded multi-die interconnect bridge (EMIB) substrate. The method can comprise forming a bridge including a plurality of routing layers, each routing layer having a plurality of fine line and spaced (FLS) traces; encapsulating a majority of the plurality of routing layers with a mold, the mold having a coefficient of thermal expansion (CTE) that is greater than a CTE of the plurality of routing layers; and embedding the bridge in an organic substrate.

In Example 28, the method of Example 27 can optionally include forming the plurality of routing layers includes forming each of the plurality of routing layers such that the CTE of each of the plurality of routing layers vanes linearly from one routing layer to another.

In Example 29, the method of Example 27 can optionally include forming the plurality of routing layers includes forming each of the plurality of routing layers such that the CTE of each of the plurality of routing layers varies non-linearly from one routing layer to another.

In Example 30, the method of any one of or any combination of Examples 27-29 can optionally include forming the plurality of routing layers includes forming a routing layer of the plurality of routing layers with the lowest CTE adjacent a die interconnect region of the EMIB substrate.

In Example 31, the method of any one of or any combination of Examples 27-30 can optionally include forming the plurality of routing layers includes forming each of the plurality of routing layers with a different silica filler content.

In Example 32, the method of Example 27 can optionally include the CTE of the plurality of routing layers being about 7/° C. and the CTE of the mold being about 30/° C.

Example 33 can include a method of manufacturing an embedded multi-die interconnect bridge (EMIB) substrate. The method can comprise forming a bridge including a plurality of routing layers, each routing layer having a plurality of traces, each of the plurality of routing layers having a coefficient of thermal expansion (CTE) that varies from about 7/° C. to about 25/° C.; encapsulating a portion of the plurality of routing layers with a mold having a CTE higher than a highest CTE of one of the plurality of routing lavers; and embedding the bridge in an organic substrate.

In Example 34, the method of Example 33 can optionally include forming the plurality of routing layers including forming each of the plurality of routing layers such that the CTE of each of the plurality of routing layers varies linearly from one routing layer to another.

In Example 35, the method of Example 33 can optionally include forming the plurality of routing layers including forming each of the plurality of routing layers such that the CTE of each of the plurality of routing layers varies non-linearly from one routing layer to another.

In Example 36, the method of any one of or any combination of Examples 33-35 can optionally include forming the plurality of routing layers including forming a routing layer of the plurality of routing layers with the lowest CTE adjacent a die interconnect region of the EMIB.

In Example 37, the method of any one of or any combination of Examples 33-36 can optionally include forming the plurality of routing layers including forming each of the plurality of routing layers with a different silica filler content.

In Example 38, the method of any one of or any combination of Examples 33-37 can optionally include the CTE of the mold being about 30/° C.

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, also contemplated are examples that include the elements shown or described. Moreover, also contemplate are examples using any combination or permutation of those elements shown or described (or one or more aspects thereof), either with respect to a particular example (or one or more aspects thereof), or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to suggest a numerical order for their objects.

The above description is intended to be illustrative, and not restrictive. For example, the above-described examples (or one or more aspects thereof) may be used in combination with others. Other embodiments may be used, such as by one of ordinary skill in the art upon reviewing the above description. The Abstract is to allow the reader to quickly ascertain the nature of the technical disclosure and is submitted with the understanding that it will not be used to interpret or limit the scope or meaning of the claims. Also, in the above Detailed Description, various features may be grouped together to streamline the disclosure. However, the claims may not set forth features disclosed herein because embodiments may include a subset of said features. Further, embodiments may include fewer features than those disclosed in a particular example. Thus, the following claims are hereby incorporated into the Detailed Description, with a claim standing on its own as a separate embodiment. The scope of the embodiments disclosed herein is to be determined with reference to the appended claims, along with the full scope of equivalents to which such claims are entitled.

The invention claimed is:

1. A device comprising:
    a substrate; and a bridge embedded in the substrate, the bridge including a plurality of routing layers, each routing layer having a plurality of traces, wherein a first routing layer of the plurality of routing layers has a first silica filler content and a second routing layer of the plurality of routing layers has a second silica filler content, the second silica filler content different than the first silica filler content, wherein the first routing layer and the second routing layer are made of the same material.

2. The device of claim 1, wherein the first routing layer has a coefficient of thermal expansion different than a coefficient of thermal expansion of the second routing layer.

3. The device of claim 1, wherein a concentration of the first silica filler content and a concentration of the second silica filler content varies linearly.

4. The device of claim 1, wherein a concentration of the first silica filler content and a concentration of the second filler content varies non-linearly.

5. The device of claim 1, wherein the first routing layer is made of a material having the first silica filler content and the second routing layer is made of the material having the second silica filler content.

6. The device of claim 1, further comprising a mold that encapsulates at least a majority of the bridge, the mold having a silica filler content that differs from the first and second silica filler contents.

7. The device of claim 6, wherein the mold has a coefficient of thermal expansion that is in between a coefficient of thermal expansion of the substrate and the first and second routing layers.

8. A device comprising:
a substrate; and
a bridge including a plurality of routing layers, the bridge at least partially embedded in the substrate,
wherein each of the plurality of routing layers is made of the same material and includes:
a plurality of traces, and
a silica filler content that differs from the silica filler content of an adjacent routing layer.

9. The device of claim 8, wherein each of the plurality of routing layers has a coefficient of thermal expansion that differs from an adjacent routing layer.

10. The device of claim 8, wherein a concentration of the silica filler content of the plurality of routing layers varies linearly.

11. The device of claim 8, wherein a concentration of the silica filler content of the plurality of routing layers varies non-linearly.

12. The device of claim 8, further comprising a mold that encapsulates at least a portion of the bridge, the mold having a silica filler content that differs from the silica content of at least one of the plurality of routing layers.

13. The device of claim 12, wherein the mold has a coefficient of thermal expansion that is in between a coefficient of thermal expansion of the substrate and the at least one of the plurality of routing layers.

14. The device of claim 8, further comprising a mold that encapsulates at least a majority of the bridge, the mold having a silica filler content that differs from the silica content of each of the plurality of routing layers.

15. A device comprising:
a substrate having a coefficient of thermal expansion;
a bridge including a plurality of routing layers made of the same material, the bridge at least partially embedded in the substrate, each of the plurality of routing layers including a plurality of traces and a silica filler content, the silica filler content of each of the plurality of routing layers differing from the silica filler content of an adjacent routing layer; and
a mold that encapsulates at least a majority of the bridge.

16. The device of claim 15, wherein a concentration the silica filler content of the plurality of routing layers varies linearly.

17. The device of claim 15, wherein a concentration of the silica filler content of the plurality of routing layers varies non-linearly.

18. The device of claim 15, wherein the mold has a silica filler content that differs from the silica filler content of at least one of the plurality of routing layers.

19. The device of claim 15, wherein a coefficient of thermal expansion of the mold is in between the coefficient of thermal expansion of the substrate and a coefficient of thermal expansion of at least one of the plurality of routing layers.

* * * * *